United States Patent
Ando et al.

(10) Patent No.: US 12,261,015 B2
(45) Date of Patent: Mar. 25, 2025

(54) ELECTRON BEAM INSPECTION APPARATUS

(71) Applicant: NuFlare Technology, Inc., Yokohama (JP)

(72) Inventors: Atsushi Ando, Edogawa-ku (JP); Takahiro Murata, Zushi (JP)

(73) Assignee: NuFlare Technology, Inc., Yokohama (JP)

( * ) Notice: Subject to any disclaimer, the term of this patent is extended or adjusted under 35 U.S.C. 154(b) by 393 days.

(21) Appl. No.: 17/823,604

(22) Filed: Aug. 31, 2022

(65) Prior Publication Data
US 2023/0113062 A1   Apr. 13, 2023

(30) Foreign Application Priority Data
Oct. 13, 2021   (JP) ................. 2021-168233

(51) Int. Cl.
*H01J 37/20* (2006.01)
*H01J 37/244* (2006.01)

(52) U.S. Cl.
CPC ............ *H01J 37/20* (2013.01); *H01J 37/244* (2013.01); *H01J 2237/0475* (2013.01);
(Continued)

(58) Field of Classification Search
CPC .. H01J 37/20; H01J 37/244; H01J 2237/0475; H01J 2237/20214;
(Continued)

(56) References Cited

U.S. PATENT DOCUMENTS

| 2,753,458 A | * 7/1956 | Ito ........................ H01J 37/12 219/121.33 |
| 6,512,227 B2 | 1/2003 | Iwabuchi et al. |

(Continued)

FOREIGN PATENT DOCUMENTS

| JP | 2000-223542 A | 8/2000 |
| JP | 2013-239386 A | 11/2013 |

(Continued)

OTHER PUBLICATIONS

Taiwanese Office Action issued on Aug. 1, 2023 in Taiwanese Patent Application No. 111130758 (with English translation), 9 pages.
(Continued)

*Primary Examiner* — David A Vanore
(74) *Attorney, Agent, or Firm* — Oblon, McClelland, Maier & Neustadt, L.L.P.

(57) ABSTRACT

In one embodiment, an electron beam inspection apparatus includes an optical system irradiating a substrate with primary electron beams, a beam separator separating, from the primary electron beams, secondary electron beams emitted as a result of irradiating the substrate with the primary electron beams, a detector detecting the secondary electron beams separated, a movable stage on which the substrate is placed, a support base supporting the substrate on the stage, and an applying unit applying a first voltage to the substrate. The support base includes a plurality of support pins that support the substrate from below. The support pins each include a columnar insulator and a metal film disposed in the insulator. A second voltage is applied to the metal film.

12 Claims, 4 Drawing Sheets

(52) U.S. Cl.
CPC ............... *H01J 2237/20214* (2013.01); *H01J 2237/20235* (2013.01); *H01J 2237/2448* (2013.01)

(58) Field of Classification Search
CPC ..... H01J 2237/20235; H01J 2237/2448; H01J 2237/0206; H01J 2237/2817; H01J 37/28; H01J 37/045
See application file for complete search history.

(56) References Cited

U.S. PATENT DOCUMENTS

| | | | | |
|---|---|---|---|---|
| 10,636,619 | B2* | 4/2020 | Suzuki | H01J 37/06 |
| 10,777,384 | B2* | 9/2020 | Kikuiri | H01J 37/244 |
| 10,867,770 | B2* | 12/2020 | Hempenius | H01J 37/09 |
| 11,315,752 | B2* | 4/2022 | Hempenius | H01J 37/20 |
| 11,538,658 | B2* | 12/2022 | Murata | G01N 23/2251 |
| 11,798,781 | B2* | 10/2023 | Li | H01J 37/285 |
| 2003/0066638 | A1* | 4/2003 | Qu | F22B 21/00 257/E23.11 |
| 2011/0115097 | A1* | 5/2011 | Shau | H01L 21/76898 257/E21.597 |
| 2011/0303844 | A1 | 12/2011 | Kanno et al. | |
| 2012/0190193 | A1* | 7/2012 | Shau | H01L 23/481 257/E21.597 |
| 2017/0263414 | A1* | 9/2017 | Chen | H01J 37/20 |
| 2019/0051487 | A1* | 2/2019 | Ogasawara | H01J 37/3177 |
| 2019/0355547 | A1* | 11/2019 | Ando | H01J 37/28 |
| 2019/0362928 | A1* | 11/2019 | Inoue | H01J 37/141 |
| 2021/0142978 | A1* | 5/2021 | Ando | H01J 37/045 |
| 2021/0202206 | A1* | 7/2021 | Takekoshi | H01J 37/265 |
| 2023/0102715 | A1* | 3/2023 | Inoue | H01J 37/1413 250/307 |
| 2023/0113062 | A1* | 4/2023 | Ando | H01J 37/20 250/310 |

FOREIGN PATENT DOCUMENTS

| | | |
|---|---|---|
| JP | 2015-185529 A | 10/2015 |
| JP | 2020-85838 A | 6/2020 |
| JP | 2021-106108 A | 7/2021 |
| KR | 10-2020-0001530 A | 1/2020 |

OTHER PUBLICATIONS

Korean Office Action issued Aug. 28, 2024, in Korean Patent Application No. 10-2022-0116827 (with unedited machine generated English translation), 13 pages.

* cited by examiner

FIG. 2
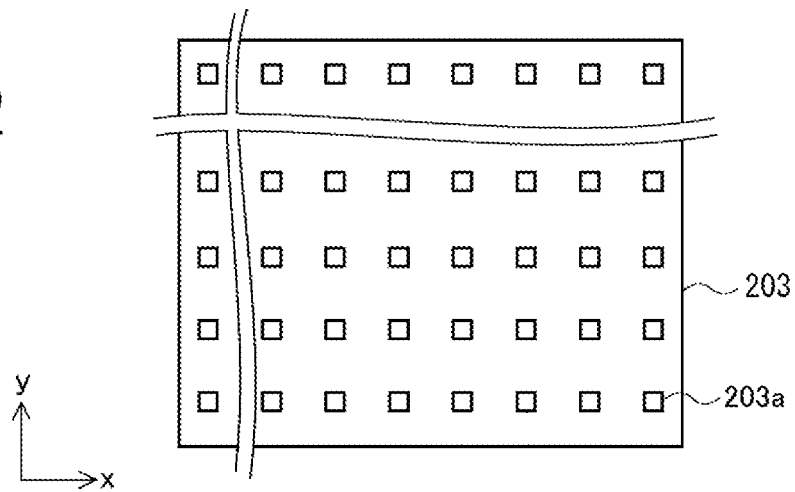
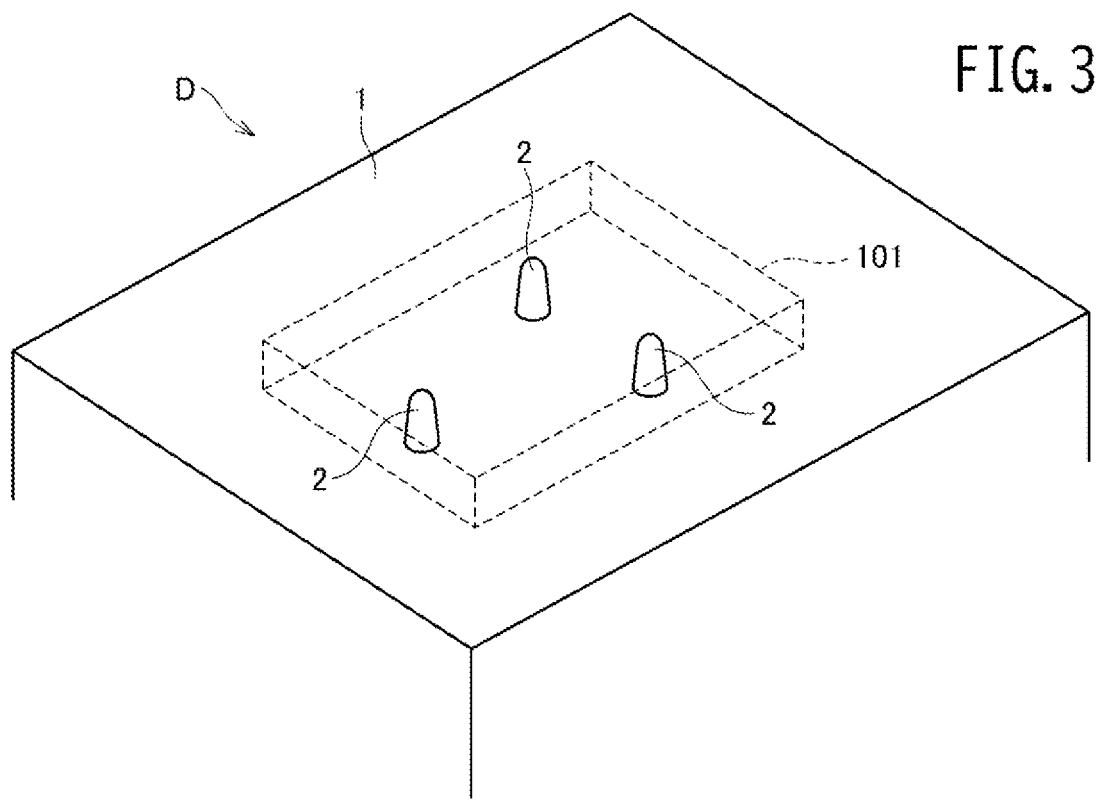
FIG. 3

ELECTRON BEAM INSPECTION APPARATUS

CROSS REFERENCE TO RELATED APPLICATION

This application is based upon and claims benefit of priority from the Japanese Patent Application No. 2021-168233, filed on Oct. 13, 2021, the entire contents of which are incorporated herein by reference.

FIELD

The present invention relates to an electron beam inspection apparatus.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern formed on a quartz is employed.

It is essential to improve yields in LSI production which requires enormous production costs. As LSI patterns formed on a semiconductor wafer become finer, the size of pattern defects that are to be detected becomes extremely small. This increases the importance of pattern inspection apparatuses that are used to detect defects in ultrafine patterns transferred onto a semiconductor wafer.

An inspection technique for detecting pattern defects is known, which involves comparing a measured image obtained by imaging a pattern formed on a substrate, such as a semiconductor wafer or a lithography mask, with design data or with a measured image obtained by imaging the same pattern on the substrate. Examples of such a technique include "die-to-die inspection" and "die-to-database inspection". The "die-to-die inspection" compares data of measured images obtained by imaging the same patterns at different points on the same substrate. The "die-to-database inspection" compares a measured image (measured data) obtained by imaging a pattern, with design image data (reference image) generated on the basis of pattern-designed design data. If the images compared do not match, it is determined that there is a pattern defect.

Inspection apparatuses are being developed, which are configured to scan a substrate to be inspected (inspection object) with an electron beam, detect secondary electrons emitted from the substrate as a result of irradiation with the electron beam, and acquire a pattern image. As inspection apparatuses using an electron beam, for example, inspection apparatuses using multiple beams are also being developed.

A technique is known in which, while an acceleration voltage for accelerating an electron beam is raised to improve resolution, a negative voltage (retarding voltage) is applied to a substrate to be inspected, so that the electron beam is decelerated immediately before reaching the substrate. The substrate to be inspected is placed on a movable stage and supported by a plurality of support pins.

Discharge may be induced by concentration of electric field in the space between the substrate to which a retarding voltage is applied and the support pins. The occurrence of such discharge often changes the path of the electron beam and degrades the accuracy of inspection. The occurrence of large discharge may even damage the inspection apparatus.

BRIEF DESCRIPTION OF THE DRAWINGS

FIG. 2 is a plan view of a shaping aperture array substrate.

FIG. 3 is a perspective view of a support base.

DETAILED DESCRIPTION

In one embodiment, an electron beam inspection apparatus includes an optical system irradiating a substrate with primary electron beams, a beam separator separating, from the primary electron beams, secondary electron beams emitted as a result of irradiating the substrate with the primary electron beams, a detector detecting the secondary electron beams separated, a movable stage on which the substrate is placed, a support base supporting the substrate on the stage, and an applying unit applying a first voltage to the substrate. The support base includes a plurality of support pins that support the substrate from below. The support pins each include a columnar insulator and a metal film disposed in the insulator. A second voltage is applied to the metal film.

Hereinafter, an embodiment of the present invention will be described based on the drawings.

Figure 1:
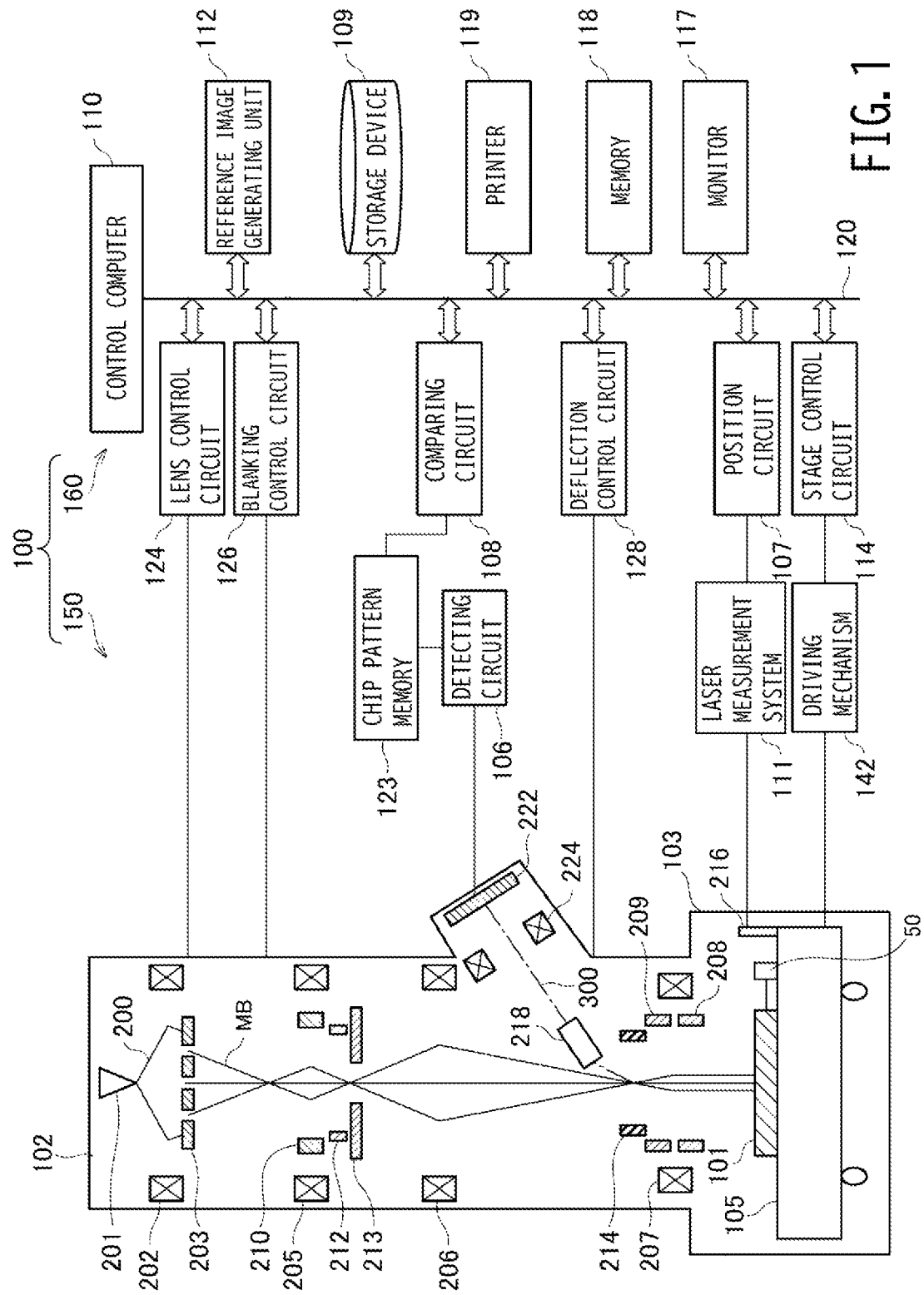
FIG. 1 is a diagram schematically illustrating a configuration of a pattern inspection apparatus according to an embodiment of the present invention.

FIG. 1 is a diagram schematically illustrating a configuration of a pattern inspection apparatus 100 according to the present embodiment. The pattern inspection apparatus 100 is configured to obtain a secondary electron image by irradiating a substrate to be inspected, with multiple beams originating from an electron beam.

As illustrated in FIG. 1, the pattern inspection apparatus 100 includes an image acquiring mechanism 150 and a control system circuit 160. The image acquiring mechanism 150 includes an electron beam column 102 (electron barrel) and an inspection chamber 103. The electron beam column 102 includes therein an electron gun 201, an electromagnetic lens 202, a shaping aperture array substrate 203, an electromagnetic lens 205, an electrostatic lens 210, a collective blanking deflector 212, a limiting aperture substrate 213, an electromagnetic lens 206, an electromagnetic lens 207 (objective lens), a main deflector 208, a sub-deflector 209, a beam separator 214, a deflector 218, an electromagnetic lens 224, and a multi-detector 222.

A stage 105 movable in the X, Y, and Z directions is disposed in the inspection chamber 103. A substrate 101 (sample) to be inspected is placed on the stage 105. Examples of the substrate 101 include an exposure mask substrate and a semiconductor substrate, such as a silicon wafer. When the substrate 101 is a semiconductor substrate, a plurality of chip patterns (wafer dies) are formed on the semiconductor substrate. When the substrate 101 is an exposure mask substrate, a chip pattern is formed on the exposure mask substrate. The chip pattern is composed of a plurality of figure patterns. The chip pattern formed on the exposure mask substrate is exposed and transferred onto a semiconductor substrate multiple times, so that a plurality of chip patterns (wafer dies) are formed on the semiconductor substrate.

The substrate 101 is placed on the stage 105, with a pattern side thereof facing upward. The stage 105 has thereon a voltage applying unit 50 that applies a retarding voltage to the upper surface (pattern side) of the substrate 101. The substrate 101 is supported from below by a support base D (see FIG. 3) described later on below.

The stage 105 has a mirror 216 disposed thereon. The mirror 216 reflects laser light for laser measurement emitted from a laser measurement system 111 disposed outside the inspection chamber 103.

The multi-detector 222 is connected to a detecting circuit 106 outside the electron beam column 102. The detecting circuit 106 is connected to a chip pattern memory 123.

In the control system circuit 160, a control computer 110 that controls the overall operation of the pattern inspection apparatus 100 is connected through a bus 120 to a position circuit 107, a comparing circuit 108, a reference image generating circuit 112, a stage control circuit 114, a lens control circuit 124, a blanking control circuit 126, a deflection control circuit 128, a storage device 109 such as a magnetic disk device, a monitor 117, a memory 118, and a printer 119.

The deflection control circuit 128 is connected through a digital-to-analog converter (DAC) amplifier (not shown) to the main deflector 208, the sub-deflector 209, and the deflector 218.

The chip pattern memory 123 is connected to the comparing circuit 108.

The stage 105 is driven by a driving mechanism 142 under the control of the stage control circuit 114. The stage 105 is movable in the horizontal direction and the rotational direction. The stage 105 is also movable in the height direction.

The laser measurement system 111 measures the position of the stage 105 by receiving light reflected off the mirror 216 using the principle of laser interferometry. The position of the stage 105 measured by the laser measurement system 111 is sent to the position circuit 107.

The lens control circuit 124 controls the electromagnetic lens 202, the electromagnetic lens 205, the electromagnetic lens 206, the electromagnetic lens 207 (objective lens), the electrostatic lens 210, the electromagnetic lens 224, and the beam separator 214.

The electrostatic lens 210 is composed of, for example, three or more electrode substrates that are open in the center thereof. An electrode substrate in the middle of the electrostatic lens 210 is controlled by the lens control circuit 124 through a DAC amplifier (not shown), and upper and lower electrode substrates of the electrostatic lens 210 are supplied with a ground potential.

The collective blanking deflector 212 is composed of two or more electrodes, each of which is controlled by the blanking control circuit 126 through a DAC amplifier (not shown).

The sub-deflector 209 is composed of four or more electrodes, each of which is controlled by the deflection control circuit 128 through a DAC amplifier. The main deflector 208 is composed of four or more electrodes, each of which is controlled by the deflection control circuit 128 through a DAC amplifier. The deflector 218 is composed of four or more electrodes, each of which is controlled by the deflection control circuit 128 through a DAC amplifier.

A high-voltage power supply circuit (not shown) is connected to the electron gun 201. By applying an acceleration voltage from the high-voltage power supply circuit between a filament (cathode) and an extraction electrode (anode) (not shown) in the electron gun 201, applying a voltage to another extraction electrode (Wehnelt) (not shown), and heating the cathode to a predetermined temperature, a group of electrons emitted from the cathode is accelerated and emitted as an electron beam 200.

FIG. 2 is a conceptual diagram illustrating a configuration of the shaping aperture array substrate 203. The shaping aperture array substrate 203 has a two-dimensional array of apertures 203a arranged at a predetermined pitch in the x and y directions. The apertures 203a are rectangular or circular (including oval) apertures with the same shape and size.

The electron beam 200 emitted from the electron gun 201 (emission source) is refracted by the electromagnetic lens 202 and illuminates the entire shaping aperture array substrate 203. The shaping aperture array substrate 203 has the plurality of apertures 203a as illustrated in FIG. 2. A region of the shaping aperture array substrate 203 including the plurality of apertures 203a is illuminated with the electron beam 200. The electron beam 200 with which the apertures 203a are irradiated passes through the apertures 203a to form multiple beams MB (multiple primary electron beams).

The multiple beams MB are refracted by the electromagnetic lens 205 and the electromagnetic lens 206 to repeatedly form an image and a crossover, and pass through the beam separator 214 disposed at a crossover of the multiple beams MB to reach the electromagnetic lens 207 (objective lens). The electromagnetic lens 207 focuses the multiple beams MB onto the substrate 101. The multiple beams MB brought into focus on the surface of the substrate 101 (sample) by the electromagnetic lens 207 are deflected together by the main deflector 208 and the sub-deflector 209 to the respective irradiation positions on the substrate 101. Since a retarding voltage (first voltage) is applied to the substrate 101, the multiple beams MB are decelerated immediately before reaching the substrate 101.

When all the multiple beams MB are deflected together by the collective blanking deflector 212, whole of the multiple beams MB are blocked by the limiting aperture substrate 213. On the other hand, the multiple beams MB not deflected by the collective blanking deflector 212 pass through a center hole of the limiting aperture substrate 213, as illustrated in FIG. 1. Turning on and off the collective blanking deflector 212 enables blanking control that collectively controls the on and off of the beams.

When the substrate 101 is irradiated with the multiple beams MB at desired positions, a flux of secondary electrons (multiple secondary electron beams 300) including reflected electrons corresponding to respective ones of the multiple beams MB (multiple primary electron beams) is emitted from the substrate 101.

The multiple secondary electron beams 300 emitted from the substrate 101 pass through the electromagnetic lens 207 to reach the beam separator 214.

In a plane orthogonal to the direction in which a central beam of the multiple beams MB travels (i.e., in a plane orthogonal to the central axis of the path), the beam separator 214 generates an electric field and a magnetic field in directions orthogonal to each other. The electric field exerts force in the same direction regardless of the direction of travel of electrons. On the other hand, the magnetic field exerts force in accordance with the Fleming's left-hand rule. The direction of force acting on electrons can thus be changed by the direction of travel of the electrons.

The multiple beams MB that enter the beam separator 214 from above travel straight downward, because the forces exerted by the electric and magnetic fields and acting on the multiple beams MB cancel each other out. On the other hand, the multiple secondary electron beams 300 that enter the beam separator 214 from below are bent obliquely upward and separated from the multiple beams MB, because the forces exerted by the electric and magnetic fields act in the same direction on the multiple secondary electron beams 300.

The multiple secondary electron beams 300 bent obliquely upward and separated from the multiple beams MB are deflected by the deflector 218, refracted by the electromagnetic lens 224, and projected onto the multi-detector 222. Note that FIG. 1 gives a simplified view, which does not depict the refraction of the path of the multiple secondary electron beams 300.

The multi-detector 222 detects the multiple secondary electron beams 300 projected thereon. The multi-detector 222 includes, for example, a diode-type two-dimensional sensor (not shown). The secondary electrons of the multiple secondary electron beams 300 collide with the diode-type two-dimensional sensor at positions corresponding to respective beams of the multiple beams MB. This intensifies the electrons inside the sensor, and generates secondary electron image data for each pixel from an amplified signal.

Detection data of secondary electrons detected by the multi-detector 222 (i.e., measured image, secondary electron image, or image to be inspected) is output to the detecting circuit 106 in order of measurement. In the detecting circuit 106, analog detection data is converted to digital data by an analog-to-digital (A/D) converter (not shown) and stored in the chip pattern memory 123. The image acquiring mechanism 150 thus acquires a measured image of a pattern formed on the substrate 101.

The reference image generating circuit 112 generates a reference image for each mask die, on the basis of design data serving as a basis for forming a pattern on the substrate 101, or design pattern data defined by exposure image data of a pattern formed on the substrate 101. For example, design pattern data is read from the storage device 109 through the control computer 110, and each figure pattern defined by the read design pattern data is converted to binary or multilevel image data.

Figures defined by the design pattern data are composed of basic elements, such as a rectangle and a triangle. Figure data is stored, which defines the shape, size, position, and others of each pattern figure by using information, such as coordinates (x, y) of a reference position of the figure, lengths of sides of the figure, and a figure code serving as an identifier for identifying the figure type, such as rectangle or triangle.

When design pattern data used as figure data is input to the reference image generating circuit 112, the data is developed into data of each figure, and the figure code indicating the figure shape of the figure data and the figure dimensions are interpreted. Then, the figure data is developed into binary or multilevel image data of the design pattern as a pattern to be arranged within squares in units of grids of predetermined quantization dimensions, and output.

In other words, the design data is read, the occupancy of a figure in the design pattern is calculated for each of squares into which an inspection region is virtually divided in units of predetermined dimensions, and n-bit occupancy data is output. For example, it is preferable to set one square as one pixel. When one pixel is given a resolution of $1/2^8$ (=1/256), small regions with a resolution of 1/256 are allocated to the region of a figure in the pixel to calculate the occupancy in the pixel. The calculated occupancy is output as 8-bit occupancy data to the reference image generating circuit 112. The square (inspection pixel) is simply sized to match the pixel of measured data.

The reference image generating circuit 112 then performs appropriate filter processing on design image data of the design pattern which is image data of the figure. Optical image data (measured image) is under the action of filtering performed thereon by the optical system or, in other words, in an analog state that continuously changes. Therefore, by also performing filter processing on image data of the design pattern which is design-side image data whose image intensity (gray value) is a digital value, it is possible to adjust the image data to the measured data. The generated image data of a reference image is output to the comparing circuit 108.

The comparing circuit 108 compares the measured image (image to be inspected) obtained by measuring the substrate 101 with the reference image corresponding thereto. Specifically, the image to be inspected and the reference image, which are positioned with respect to each other, are compared pixel-by-pixel. The comparing circuit 108 compares them pixel-by-pixel by using a predetermined determination threshold, in accordance with predetermined determination conditions, and determines whether there is a defect, such as a shape defect. For example, if a difference in pixel-by-pixel gray level is greater than a determination threshold Th, the comparing circuit 108 determines the pixel as a defect candidate, and outputs the result of the comparison. The result of the comparison may be stored in the storage device 109 or the memory 118, displayed on the monitor 117, or may be printed out from the printer 119.

Besides the die-to-database inspection described above, the die-to-die inspection may be performed. The die-to-die inspection compares data of measured images obtained by imaging the same patterns at different points on the same substrate 101. Accordingly, from the substrate 101 on which the same figure patterns (first and second figure patterns) are formed at different positions by the multiple beams MB (electron beams), the image acquiring mechanism 150 acquires measured images that are secondary electron images of one figure pattern (first figure pattern) and the other figure pattern (second figure pattern). In this case, the acquired measured image of the one figure pattern serves as a reference image, and the acquired measured image of the other figure pattern serves as an image to be inspected. The acquired images of the one figure pattern (first figure pattern) and the other figure pattern (second figure pattern) may be within the same chip pattern data, or may be separate in different pieces of chip pattern data. The inspection may be carried out in the same manner as the die-to-database inspection.

Figure 4:
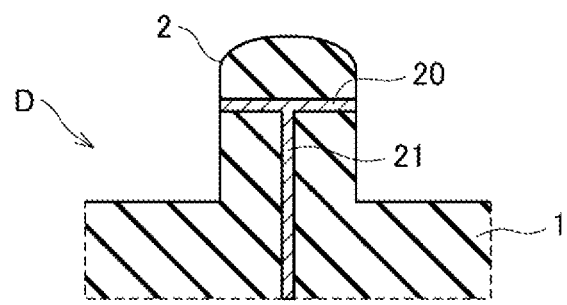
FIG. 4 is a cross-sectional view of a support pin.
Figure 5:
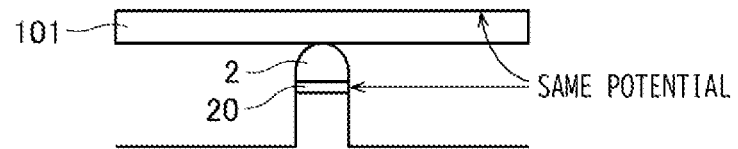
FIG. 5 is a schematic diagram of a support pin and a substrate.

With reference to FIG. 3 to FIG. 5, the support base D that supports the substrate 101 on the stage 105 will be described. As illustrated in FIG. 3, the support base D includes a plate-like mount 1 and a plurality of support pins 2 protruding upward from the mount 1. For example, three support pins 2 protrude from the mount 1 and support the substrate 101 at three points.

As illustrated in FIG. 4, the support pin 2 is a columnar member, for example a cylindrical member with no cavity, having a convex surface at the tip (upper end) thereof. The support pin 2 has a metal film 20 in the middle thereof in the height direction. For example, the metal film 20 is disposed to extend in a direction orthogonal to the height direction or, in other words, disposed parallel to the principal surface (upper surface) of the mount 1. A wire 21 extends vertically from the lower surface of the metal film 20 in such a way that any voltage can be applied to the metal film 20. The support base D, except the metal film 20 and the wire 21, is formed by an insulator.

The diameter of the support pin 2 in the horizontal direction is greater than or equal to about 5 mm and less than or equal to about 15 mm, and the height of the support pin 2 (i.e., the height from the principal surface of the mount 1 to the tip of the support pin 2) is greater than or equal to about 15 mm and less than or equal to about 30 mm. The height of the metal film 20 from the principal surface of the mount 1 is preferably greater than or equal to about 30% of the height of the support pin 2.

In the present embodiment, a voltage (second voltage) is applied through the wire 21 to the metal film 20 in such a way that the metal film 20 and the surface of the substrate 101 have the same potential, as illustrated in FIG. 5. The application of a voltage to the metal film 20 is controlled, for example, by the stage control circuit 114.

Figure 6:
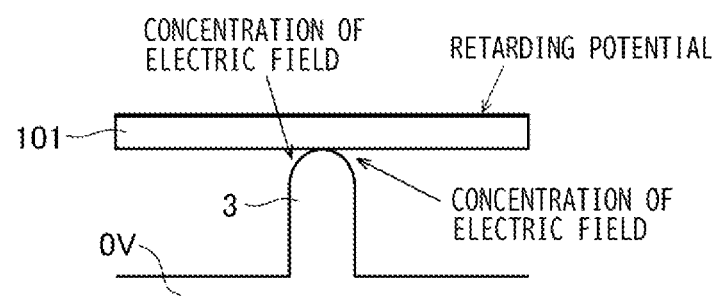
FIG. 6 is a schematic diagram of a support pin and a substrate in a comparative example.

FIG. 6 illustrates a comparative example in which a support pin 3 formed only by an insulator, without a metal film, supports the substrate 101. In this case, concentration of electric field in the space between the tip of the support pin 3 and the substrate 101 to which a retarding voltage is applied may cause discharge to occur.

In the present embodiment, where the metal film 20 in the support pin 2 and the surface of the substrate 101 have the same potential, it is possible to reduce concentration of electric field in the space between the tip of the support pin 2 and the substrate 101. This prevents the occurrence of discharge and enables highly accurate inspection.

Figure 7:
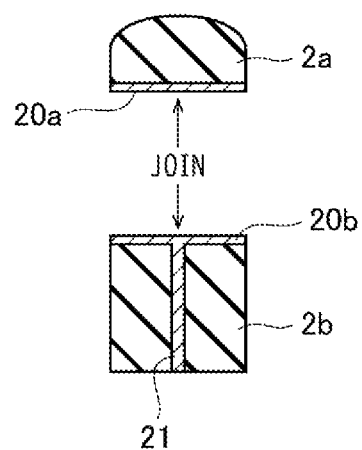
FIG. 7 is a diagram illustrating a method for producing a support pin.

As illustrated in FIG. 7, the support pin 2 can be produced by joining a tip portion 2a and a base portion 2b. The tip portion 2a has a flat circular bottom surface, a peripheral side surface that extends upward from the outer edge of the bottom surface, and a convex surface extending continuously from the upper end of the peripheral side surface. The tip portion 2a has a metal film 20a on the bottom surface thereof.

The base portion 2b is a columnar member, for example a cylindrical member with no cavity, with a metal film 20b on the upper surface thereof. The base portion 2b has the wire 21 at the position of the central axis thereof. The wire 21 is connected at an upper portion thereof to the metal film 20b. Examples of a material that can be used to make the wire 21 include titanium and silver.

Example of an insulating material that can be used to make the tip portion 2a and the base portion 2b include sapphire, cordierite, steatite, alumina, yttria, silicon carbide, aluminum nitride, and zirconia.

The metal films 20a and 20b on the bottom surface of the tip portion 2a and the upper surface of the base portion 2b, respectively, can be formed for example by coating, evaporation, or sputtering. The metal films 20a and 20b may be brazed together by means of, for example, an alloy of silver, copper, and titanium.

By joining the metal film 20a on the bottom surface of the tip portion 2a to the metal film 20b on the upper surface of the base portion 2b, the tip portion 2a and the base portion 2b are integrated to form the support pin 2. The method of joining the metal films 20a and 20b is not particularly limited. For example, the metal films 20a and 20b may be joined by a known heat-resistant inorganic adhesive, or may be joined by solid-phase bonding or diffusion bonding.

To form the metal film 20 and bond the tip portion 2a and the base portion 2b together, a conductive adhesive, such as a silver paste, may be used.

In the support pin 2 illustrated in FIG. 4, the end portion of the metal film 20 is exposed at the side surface of the support pin 2. This may generate an electric field along the surface (or lateral direction) of the support pin 2 and cause discharge to occur.

Figure 8:
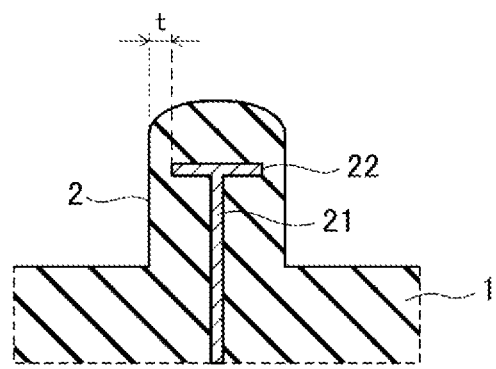
FIG. 8 is a cross-sectional view of a support pin.

Accordingly, it is preferable, as illustrated in FIG. 8, that a metal film 22 be disposed in such a way that the end portion thereof is not exposed at the side surface of the support pin 2. The gap (depth) t between the side surface of the support pin 2 and the outer edge of the metal film 20 is preferably greater than or equal to 0.3 mm and less than or equal to 2 mm.

By making the potential of the metal film 22 equal to that of the surface of the substrate 101, it is possible to reduce concentration of electric field in the space between the tip of the support pin 2 and the substrate 101, and to also more effectively reduce generation of electric field along the surface (or lateral direction) of the support pin 2. This prevents the occurrence of discharge and enables highly accurate inspection.

Figure 9:
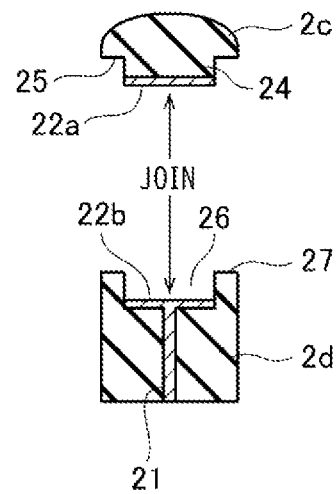
FIG. 9 is a diagram illustrating a method for producing the support pin.

The support pin 2 illustrated in FIG. 8 may be produced by joining, for example, a tip portion 2c and a base portion 2d illustrated in FIG. 9.

The tip portion 2c has a protrusion 24 protruding downward in the center of a circular bottom surface 25 (lower surface) thereof. The tip portion 2c has a peripheral side surface extending upward from the outer edge of the bottom surface 25, and a convex surface extending continuously from the upper end of the peripheral side surface. The protrusion 24 has a metal film 22a on the end surface (lower end surface) thereof.

The base portion 2d is a columnar member, for example a cylindrical member with no cavity, with a recess (or depression) 26 in the center of the upper surface thereof. The base portion 2d has a metal film 22b on the bottom surface of the recess 26. The base portion 2d has the wire 21 at the position of the central axis thereof. The wire 21 is connected at an upper portion thereof to the metal film 22b.

By fitting the protrusion 24 of the tip portion 2c into the recess 26 in the base portion 2d, the bottom surface 25 of the tip portion 2c is brought into contact with the upper surface 27 of the base portion 2d. Joining the tip portion 2c to the base portion 2d can thus produce the support pin 2 having the configuration illustrated in FIG. 8.

Although an inspection apparatus using multiple beams has been described in the embodiment, the inspection apparatus may be one that uses a single beam.

It is preferable that the metal films 20 and 22 of the support pin 2 have the same potential as the surface of the substrate 101. Even with some difference in potential between them, however, the concentration of electric field in the space between the support pin 2 and the substrate 101 can be reduced more effectively than with the configuration illustrated in FIG. 6.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electron beam inspection apparatus comprising:
an optical system irradiating a substrate with primary electron beams;
a beam separator separating, from the primary electron beams, secondary electron beams emitted as a result of irradiating the substrate with the primary electron beams;
a detector detecting the secondary electron beams separated;
a movable stage on which the substrate is placed;
a support base supporting the substrate on the stage; and
an applying unit applying a first voltage to the substrate, wherein the support base includes a plurality of support pins that support the substrate from below,
the support pins each include a columnar insulator and a metal film disposed in the insulator, and
a second voltage is applied to the metal film.

2. The apparatus according to claim 1, wherein the first voltage and the second voltage are equal.

3. The apparatus according to claim 1, wherein the metal film is covered with the insulator.

4. The apparatus according to claim 3, wherein the metal film is disposed to extend in a direction orthogonal to a height direction of the support pin, and
a gap between a side surface of the support pin and an end portion of the metal film is greater than or equal to 0.3 mm and less than or equal to 2 mm.

5. The apparatus according to claim 3, wherein the insulator includes a base portion with a recess in an upper surface thereof and a tip portion with a protrusion in a lower surface thereof, and the protrusion is fitted in the recess, and
the metal film is disposed between a bottom surface of the recess and a lower end surface of the protrusion.

6. The apparatus according to claim 1, wherein the metal film is disposed to extend in a direction orthogonal to a height direction of the support pin; and
a wire for voltage application extends vertically from a lower surface of the metal film.

7. The apparatus according to claim 6, wherein the support base includes a plate-like mount,
the support pin protrudes upward from the mount, and
a height of the metal film from a principal surface of the mount is greater than or equal to 30% of a height of the support pin.

8. The apparatus according to claim 7, wherein the height of the support pin is greater than or equal to 15 mm and less than or equal to 30 mm.

9. The apparatus according to claim 1, wherein the support pins are columnar members, each having a convex surface at an upper end thereof.

10. The apparatus according to claim 9, wherein the support pins each include
a tip portion having a flat circular bottom surface, a peripheral side surface extending upward from an outer edge of the bottom surface, and the convex surface extending continuously from an upper end of the periphery, and
a columnar base portion.

11. The apparatus according to claim 10, wherein the tip portion has a first metal film on the bottom surface thereof, the base portion has a second metal film on an upper surface thereof, and the first metal film is joined to the second metal film.

12. The apparatus according to claim 10, wherein the bottom surface of the tip portion is bonded to an upper surface of the base portion with a conductive adhesive.

* * * * *